(12) United States Patent
Huang et al.

(10) Patent No.: US 7,616,469 B2
(45) Date of Patent: Nov. 10, 2009

(54) SUPER LEAKAGE CURRENT CUT-OFF DEVICE FOR TERNARY CONTENT ADDRESSABLE MEMORY

(75) Inventors: Po-Tsang Huang, Hsinchu (TW); Wen-Yen Liu, Hsinchu (TW); Wei Hwang, La Verne, CA (US)

(73) Assignee: National Chiao Tung University, Hsinchu (TW)

( * ) Notice: Subject to any disclaimer, the term of this patent is extended or adjusted under 35 U.S.C. 154(b) by 123 days.

(21) Appl. No.: 12/007,824

(22) Filed: Jan. 16, 2008

(65) Prior Publication Data

US 2009/0161399 A1  Jun. 25, 2009

(30) Foreign Application Priority Data

Dec. 25, 2007   (TW) ............................. 96149999 A

(51) Int. Cl.
*G11C 7/00* (2006.01)

(52) U.S. Cl. .................................. 365/49.17; 365/226
(58) Field of Classification Search .............. 365/49.17, 365/226
See application file for complete search history.

(56) References Cited

U.S. PATENT DOCUMENTS

| | | | | |
|---|---|---|---|---|
| 6,731,526 | B2 * | 5/2004 | Inoue .................... | 365/49.17 |
| 6,900,999 | B1 * | 5/2005 | Yen et al. ............... | 365/49.15 |
| 7,042,747 | B1 * | 5/2006 | Castagnetti et al. ...... | 365/49.15 |
| 7,274,581 | B1 * | 9/2007 | Powell et al. ........... | 365/49.16 |
| 7,450,409 | B1 * | 11/2008 | Maheshwari ............. | 365/49.1 |

* cited by examiner

*Primary Examiner*—Michael T Tran
(74) *Attorney, Agent, or Firm*—Rosenberg, Klein & Lee

(57) ABSTRACT

A super leakage current cut-off device for a ternary content addressable memory (TCAM) is provided. For various operations of the TCAM, the device uses the high-end and low-end power gating control transistors to turn on/off the don't-care cells to reduce the leakage current passing through the don't-care cells.

7 Claims, 4 Drawing Sheets

SUPER LEAKAGE CURRENT CUT-OFF DEVICE FOR TERNARY CONTENT ADDRESSABLE MEMORY

BACKGROUND OF THE INVENTION

1. Field of the Invention

The present invention relates to a super leakage current cut-off device for a ternary content addressable memory.

2. Description of the Prior Art

A Ternary Content Addressable Memory (TCAM) is grouped into several array segments, and each segment includes an array of TCAM cell pairs. Each TCAM cell pair is a bit that includes a storage cell and a don't-care cell, and a cell has an inverter pair of two cascading inverters. Each bit may be in a "0" state, an "1" state or an "X" state that is also called don't-care state.

The charging terminal and discharging terminal of the don't-care cell connect respectively an electrical power source and the ground, so a leakage current through the don't-care cell is accompanied. The smaller the microelectric circuit scale approaches, the more serious the power consumption of leakage current is, and moreover it damages the reliability of the microelectric circuit. Therefore, the invention proposes a solution of reducing the leakage current for the don't-care cell of a TCAM.

SUMMARY OF THE INVENTION

The invention provides a super leakage current cut-off device to reduce the leakage current through the don't-care cell of the TCAM. A super cut-off power gating control apparatus uses two high-end power gating transistors connected to between the charging terminal of the inverter pairs of the don't-care cells in a segment and the power source with voltage $V_{DD}$ and two low-end power gating transistors between the discharging terminal and the ground. The high-end and the low-end power gating transistors can be controlled respectively by the high-end and low-end gate voltage to form a zigzag cut-off control circuit to reduce the leakage current.

Further, the high-end or low-end gate transistors can be turned off by imposing the super cut-off voltage on the gate electrode of the high-end and low-end gate transistors to stress the leakage current more. That is called super cut-off power gating control circuit.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The detailed explanation of the present invention is described as following. The described preferred embodiments are presented for purposes of illustrations and description, and they are not intended to limit the scope of the present invention.

Figure 1:
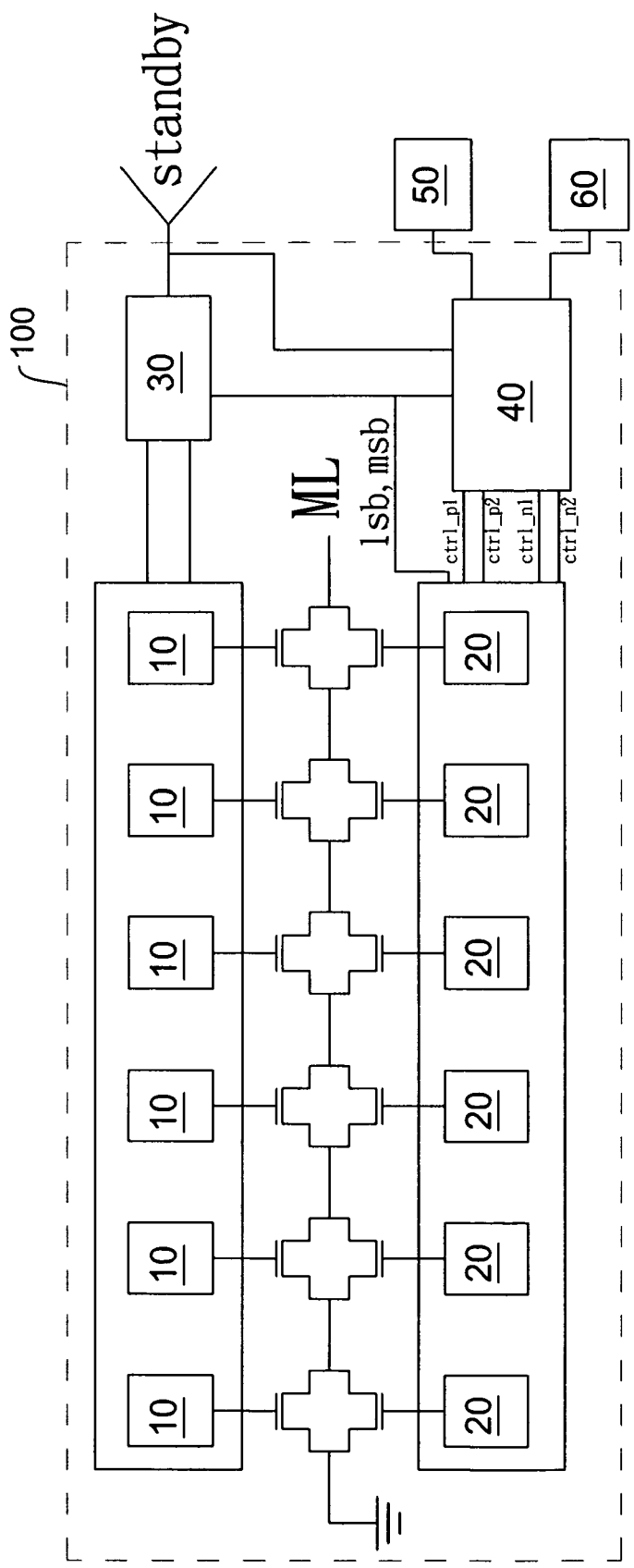
FIG. 1 is a schematic diagram showing the structure of TCAM according to one embodiment of the present invention.

A ternary content addressable memory (TCAM) is grouped into several segments, and the schematic circuit of a segment is shown in FIG. 1 as an explanation example. In this embodiment, one segment 100 includes six bits, and the storage cell 10 and don't-care cell 20 of a bit are connected to the match line (ML) by NMOSs. In a TCAM segment, each storage cell 10 connects to the multi-mode power gating control apparatus 30 to reduce the leakage current through the storage cell 10, and each don't-care cell 20 to the super cut-off power gating control circuit 40 to reduce the leakage current through the don't-care cell 20.

The multi-mode power gating control apparatus 30 is disclosed in a Taiwan patent application TW96149397, and the super cut-off power gating control circuit 40 is disclosed here.

As shown in figure, the don't-care cells of each segment 100 use a super cut-off power gating control circuit 40, and connect an external voltage doubler 50 and an external super cut-off voltage generator 60 to reduce the leakage current through don't-care cells 20. The voltage doubler 50 and the super cut-off voltage generator 60 are employed to provide positive super cut-off voltage $V_{SH}$ and negative super cut-off voltage $V_{SL}$, respectively.

The super cut-off power gating control circuit 40 receives the storage value msb of the first bit of a don't-care cell 20, the storage value lsb of the final bit of the don't-care cell 20 and standby signal to control first high-end control voltage signal ctrl_p1, second high-end control voltage signal ctrl_p2, first low-end control voltage signal ctrl_n1 and second low-end control voltage signal ctrl_n2 to reduce the leakage current through don't-care cell 20.

Figure 2:
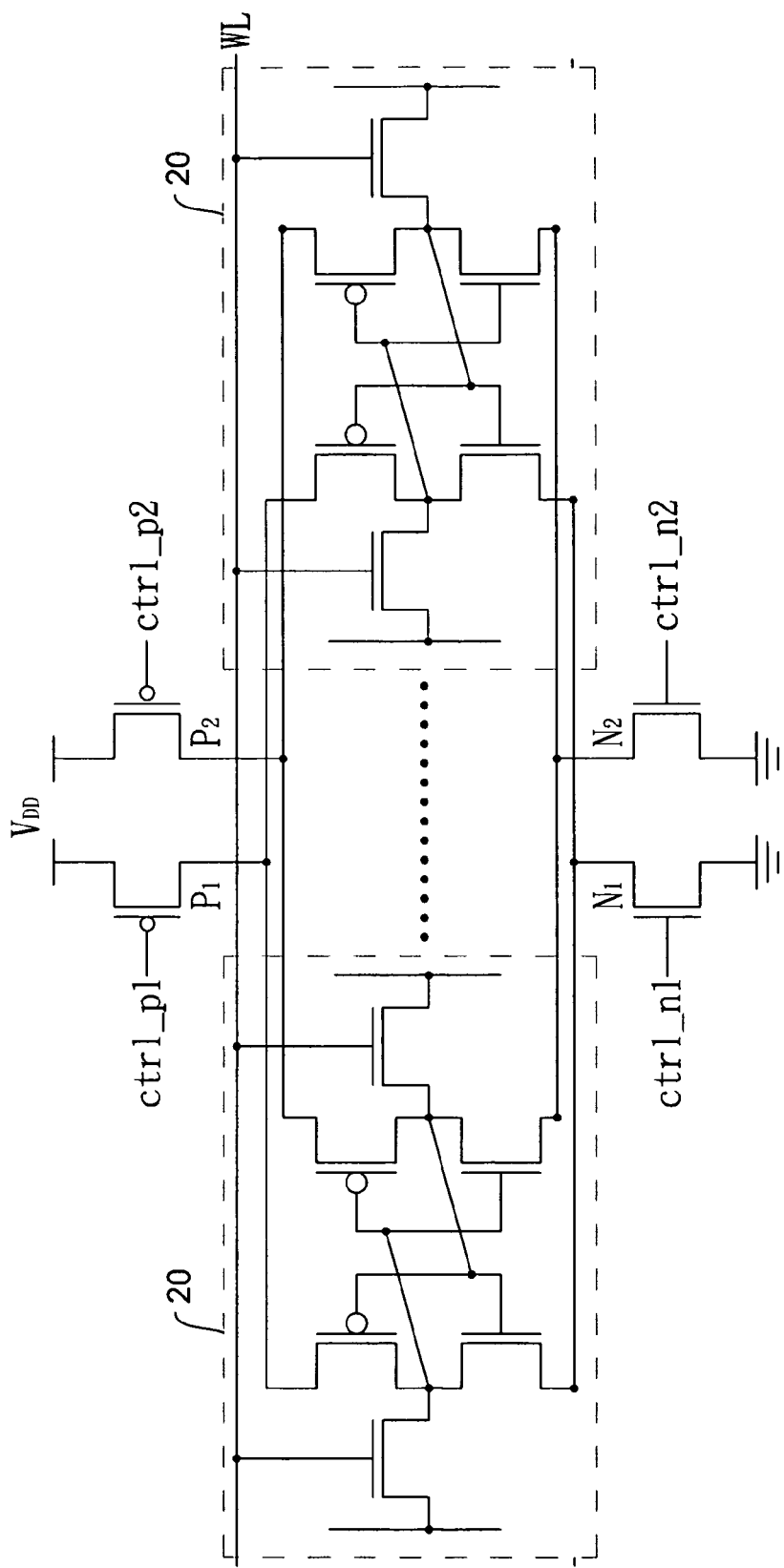
FIG. 2 is a diagram showing the connection of the super cut-off power gating control circuit to a TCAM segment of the don't-care cells according to one embodiment of the present invention.

Refer to FIG. 2, which show the how the high-end and the low-end power gating transistors of a super cut-off power gating control circuit 40 connect to the don't-care cell 20. The don't-care cell 20 includes an inverter pair including a left inverter and a right inverter. Instead of directly connecting to the voltage source with voltage $V_{DD}$, the charging terminals of the inverters are firstly connected to the first high-end power gating transistor $P_1$ and the second high-end power gating transistor $P_2$, then to $V_{DD}$, that forms the first virtual charging terminal and the second virtual charging terminal, respectively. Similarly, the discharging terminals of the inverters are firstly connected to the first low-end power gating transistor $N_1$ and the second low-end power gating transistor $N_2$, then to the ground to form the first virtual ground and the second virtual ground, respectively. The "left" and "right" indicate the connectionship but real position in space.

In this embodiment, the high-end power gating transistors $P_1$ and $P_2$ are p-channel metal oxide semiconductor field effect transistors (PMOSs). The source electrodes of $P_1$ and $P_2$ connect to $V_{DD}$, and the drain electrodes of $P_1$ and $P_2$ to the discharging terminals of the left inverter and the right inverter of the don't-care cell 20, respectively. And, the gate electrodes of $P_1$ and $P_2$ is used to receive crtl_p1 and crtl_p2.

The low-end power gating transistors $N_1$ and $N_2$ are n-channel metal oxide semiconductor field effect transistors (NMOSs). The drain electrodes of $N_1$ and $N_2$ respectively connect to the discharging terminals of the left inverter and the right inverter of the don't-care cell 20, and the source electrodes of $N_1$ and $N_2$ to the ground. And, the gate electrodes of $N_1$ and $N_2$ is used to receive crtl_n1 and crtl_n2.

When crtl_p1 turns on $P_1$, the $N_1$ and $P_2$ are turned off but $N_2$ on; and when crtl_p1 turn off $P_1$, the $N_1$ and $P_2$ are turned on but $N_2$ off, and thus a zigzag cut-off control circuit is formed to reduce the leakage current. $P_1$, $P_2$ and $N_1$, $N_2$ can be expressed by super cut-off voltages $V_{SH}$ and $V_{SL}$ respectively to further reduce the leakage current when they are turned off. The control circuit of $P_1$ and $P_2$ is called high-end voltage signal controller and shown in FIG. 3, and the control circuit of $N_1$ and $N_2$ is call low-end voltage signal controller and shown in FIG. 4.

Figure 3:
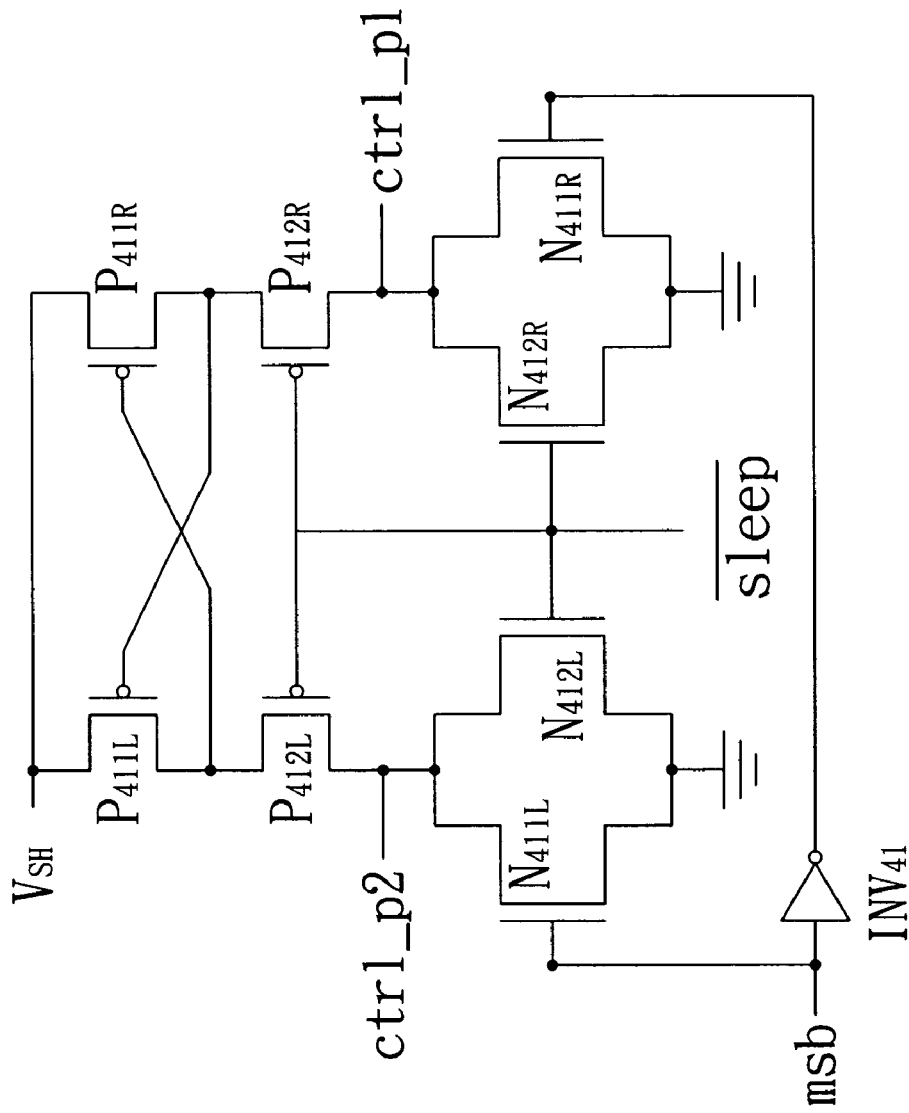
FIG. 3 is a diagram showing the controller circuit of the high-end control voltage signal according to one embodiment of the present invention.

FIG. 3 shows the circuit of the high-end voltage signal controller. The high-end voltage signal controller includes a first PMOS $P_{411L}$, a first right PMOS $P_{411R}$, a second left PMOS $P_{412L}$, a second right PMOS $P_{412R}$, a first left NMOS $N_{411L}$, a first right NMOS $N_{411R}$, a second left NMOS $N_{412L}$, a second right NMOS $N_{412R}$ and an inverter $INV_{41}$. The "left" and "right" indicates the connectionship but real position in space.

The source electrodes of $P_{411L}$ and $P_{411R}$ are expressed by the $V_{SH}$. The gate electrode of $P_{411L}$ is connected to the drain electrode of $P_{411R}$, and the gate electrode $P_{411R}$ to the drain electrode of $P_{411L}$. The source electrodes of $P_{412L}$ and $P_{412R}$ respectively are connected to the drain electrodes of $P_{411L}$ and $P_{411R}$, and the gate electrodes of $P_{412L}$ and $P_{412R}$ are coupled together, the interconnected point is expressed by the signal $\overline{sleep}$, which means the inverse signal of the signal sleep. The drain electrodes of $N_{411L}$ and $N_{411R}$ respectively connect the drain electrodes of $P_{412L}$ and $P_{412R}$, and the source electrodes of $N_{411L}$ and $N_{411R}$ are connected to the ground. and the gate electrodes of $N_{411L}$ and $N_{411R}$ are connected through the $INV_{41}$ and expressed by the signal msb. The drain electrodes of $N_{412L}$ and $N_{412R}$ are coupled receptively to the drain electrodes of $N_{411L}$ and $N_{411R}$, and the source electrodes of $N_{412L}$ and $N_{412R}$ are coupled receptively to the source electrodes of $N_{411L}$ and $N_{411R}$, and the gate electrodes of $N_{412L}$ and $N_{412R}$ are coupled together and expressed by the $\overline{sleep}$. The drain electrodes of $P_{412L}$ and $P_{412R}$ output receptively the crtl_p2 and crtl_p1.

Figure 4:
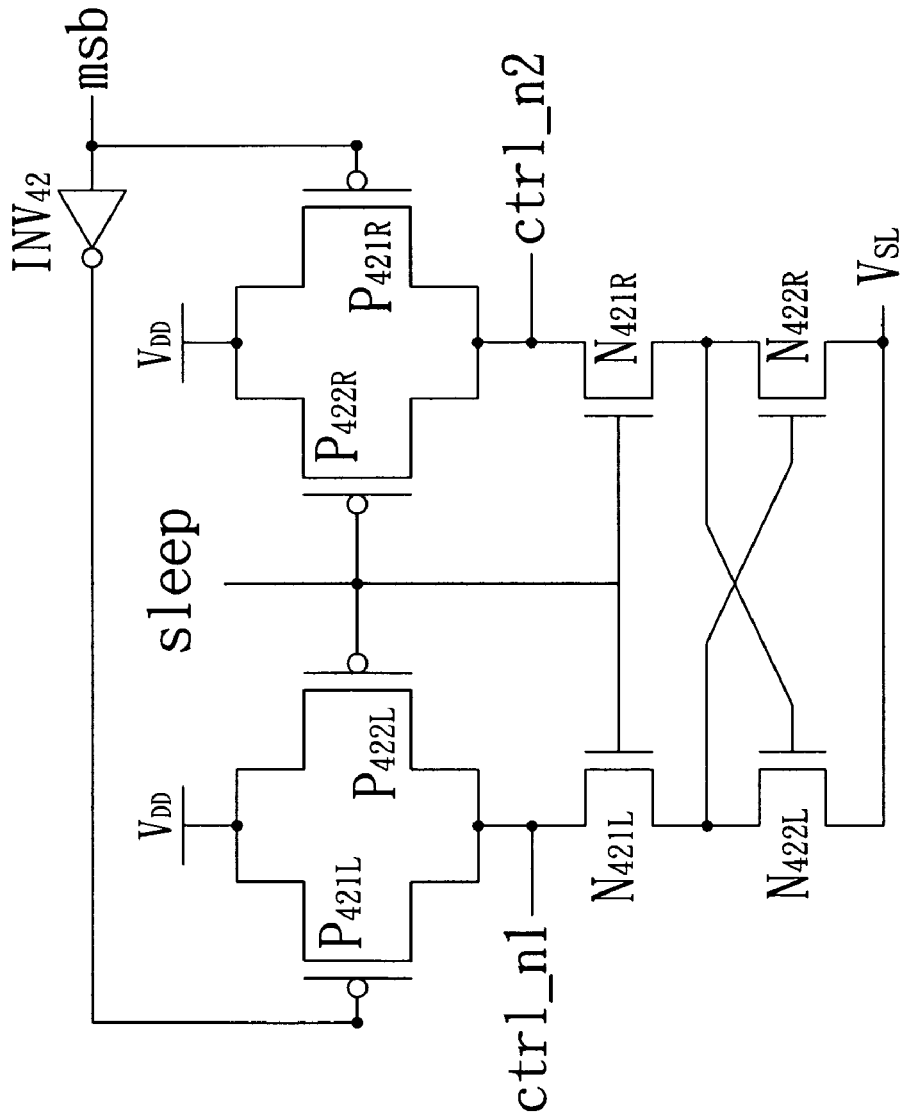
FIG. 4, is a diagram showing the controller circuit of the low-end control voltage signal according to one embodiment of the present invention.

Continuously, the low-end voltage signal controller is explained by accompanying the FIG. 4. The low-end voltage signal controller includes a first left $P_{421L}$, a first right $P_{421R}$, a second left $P_{422L}$, a second right $P_{422R}$, a first left $N_{421L}$, a first right $N_{421R}$, a second left $N_{422L}$, a second right $N_{422R}$ and an inverter $INV_{42}$. The "left" and "right" indicates the connectionship but real position in space.

The source electrodes of $P_{421L}$ and $P_{421R}$ are connected to voltage $V_{DD}$, which is 1.2 volt in the embodiment. The source electrodes of $P_{421L}$ and $P_{421R}$ are connected through the $INV_{42}$ and expressed by the signal msb. The source electrodes of $P_{422L}$ and $P_{422R}$ and the drain electrodes of $P_{422L}$ and $P_{422R}$ are respectively coupled to the source electrodes of $P_{421L}$ and $P_{421R}$ and the drain electrodes $P_{421L}$ and $P_{421R}$. The gate electrodes of $P_{422L}$ and $P_{422R}$ are coupled together and expressed by the signal sleep. The drain electrodes of $N_{421L}$ and $N_{421R}$ are respectively coupled to the drain electrodes of $P_{421L}$ and $P_{421R}$, and the gate electrodes of $N_{421L}$ and $N_{421R}$ are coupled together and expressed by the signal sleep. The drain electrodes of $N_{422L}$ and $N_{422R}$ are respectively coupled to the source electrodes of $N_{421L}$ and $N_{421R}$, and the source electrodes of $N_{422L}$ and $N_{422R}$ are expressed by the minus voltage $V_{SL}$, and the gate electrodes of $N_{422L}$ and $N_{422R}$ are inter-connected to the drain electrodes of $N_{422R}$ and $N_{422L}$. The source electrodes of $N_{421L}$ and $N_{421R}$ output crtl_n1 and crtl_n2, respectively.

Table 1 illustrates the relationship of the signals sleep, msb to crtl_p1, crtl_p2, crtl_n1 and crtl_n2.

TABLE 1

| sleep | msb | ctrl_p1 | ctrl_p2 | ctrl_n1 | ctrl_n2 |
|---|---|---|---|---|---|
| 0 | 1 | 0 | 0 | $V_{DD}$ | $V_{DD}$ |
| 0 | 0 | 0 | 0 | $V_{DD}$ | $V_{DD}$ |
| 1 | 1 | $V_{SH}$ | 0 | $V_{DD}$ | $V_{SL}$ |
| 1 | 0 | 0 | $V_{SH}$ | $V_{SL}$ | $V_{DD}$ |

When sleep=0, the crtl_p1 and crtl_p2 are equal to the ground voltage, denoted by 0 in this table and the crtl_n1 and crtl_n2 are equal to the high voltage, supplied by the voltage source and denoted by $V_{DD}$, and the super cut-off power gating control circuit technology is not suitable (means it is not used). When sleep=1, the crtl_p1, crtl_p2, crtl_n1 and crtl_n2 vary with the signal msb, and it means the technology is suitable for reducing the leakage current. If msb=0, that crtl_p1=0, crtl_p2=$V_{SH}$, crtl_n2=$V_{DD}$ and crtl_n1=$V_{SL}$, and if msb=1, crtl_p1=$V_{SH}$, crtl_p2=0, crtl_n2=$V_{SL}$, and crtl_n1=$V_{DD}$. In this embodiment, $V_{DD}$=1.2 volt, $V_{SH}$=1.5 volt and $V_{SL}$=−0.3 volt.

Finally, by accompanying the Table. 2, the suitable operations and mode can be found. Table 2 illustrates the relationship of standby, lsb, msb, and sleep.

TABLE 2

|  | msb = lsb = 0 | msb ≠ lsb | msb = lsb = 1 |
|---|---|---|---|
| Write operation | sleep = 0 | sleep = 0 | sleep = 0 |
| Read operation | sleep = 1 | sleep = 0 | sleep = 1 |
| Refer operation | sleep = 1 | sleep = 0 | sleep = 1 |
| Standby mode | sleep = 1 | sleep = 0 | sleep = 1 |

When in write operation or msb≠lsb, sleep=0 represents the not suitable operations or mode; on the contrary, in other operation mode, sleep=1 represents the suitable operations or mode, which can use this art to reduce the leakage current.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A super leakage current cut-off device, applied to a ternary content addressable memory (TCAM), utilizing a super cut-off power gating control circuit to reduce the leakage current through the don't-care cells of said TCAM, wherein said super cut-off power gating control circuit comprises:

a first high-end power gating transistor connected between a charging terminal of a first inverter of a don't-care cell in said TCAM and a voltage source;

a second high-end power gating transistor connected between a charging terminal of a second inverter of said don't-care cell in said TCAM and said voltage source;

a first low-end power gating transistor connected between a discharging terminal of said first inverter of said don't-care cell in said TCAM and the ground; and a second low-end power gating transistor connected between a discharging terminal of said second inverter of said don't-care cell in said TCAM and the ground;

wherein the gate electrodes of said first high-end power gating transistor, said second high-end power gating transistor, said first low-end power gating transistor and said second low-end power gating transistor respectively are expressed respectively by a first high-end voltage signal, a second high-end voltage signal, a first low-end voltage signal and a second low-end voltage signal to determine turn on/off said first high-end power gating transistor, said second high-end power gating transistor, said first low-end power gating transistor and said second low-end power gating transistor to reduce the leakage current through said don't-care cells in said TCAM according to a switching control signal.

2. The super leakage current cut-off device according to claim 1, further comprising a high-end voltage signal controller, which is connected to a voltage doubler and said don't-care cells of said TCAM to generate said first high-end voltage signal and said second high-end voltage signal.

3. The super leakage current cut-off device according to claim 2, wherein said high-end voltage controller comprises:
   a first left PMOS and a first right PMOS, wherein the source electrodes are connected to said voltage doubler and expressed by a high-end super cut-off voltage providing by said voltage doubler, the source electrode of said first left PMOS is connected to the gate electrode of said first right PMOS and the source electrode of said first right PMOS to the gate electrode of said first left PMOS;
   a second left PMOS and a second right PMOS, wherein the source electrodes of said second left PMOS and said second PMOS are respectively connected to the gate electrodes of said first left PMOS and said first right PMOS, and the gate electrodes of said second left PMOS and said second right PMOS are connected together and expressed by said switching control signal;
   a first left NMOS and a first right NMOS, wherein the drain electrodes of said first left NMOS and said first right NMOS are respectively connected to the drain electrodes of said second left PMOS and said second right PMOS, and the source electrodes of said first left NMOS and said first right NMOS are coupled to the ground, and the gate electrodes of said first left NMOS and said first right NMOS are connected through an inverter and expressed by a storage voltage of the first one of said don't-care cells in said TCAM; and
   a second left NMOS and a second right NMOS, wherein the drain electrodes of said second left NMOS and said second right NMOS are respectively coupled to the drain electrodes of said first right NMOS and said first right NMOS, and the source electrodes of said second left NMOS and said second right NMOS are respectively coupled to the source electrodes of said first left NMOS and said first right NMOS, and the gate electrodes of said second left NMOS and said second right NMOS are coupled together and expressed by said switching control signal.

4. The super leakage current cut-off device according to claim 1, further comprising a low-end voltage signal controller, which is connected to a super cut-off voltage generator and said don't-care cell of TCAM to generate said first low-end control voltage signal and said second low-end control voltage signal.

5. The super leakage current cut-off device according to claim 4, wherein said low-end voltage signal controller comprises:
   a first left PMOS and a first right PMOS, wherein the source electrodes of said first left PMOS and said first right PMOS are connected to a voltage source with a positive voltage, and the gate electrodes of said first left PMOS and said first right PMOS are connected through an inverter and expressed by a storage voltage of the first one of said don't-care cells in said TCAM;
   a second left PMOS and a second right PMOS, wherein the source electrodes of said second left PMOS and said second right PMOS are respectively connected to the source electrodes of said first left PMOS and said first right PMOS, and the drain electrodes of said second left PMOS and said second right PMOS are respectively connected to the drain electrodes of said first left PMOS and said first right PMOS, and the gate electrodes of said second left PMOS and said second right PMOS are coupled together and expressed by said switching control signal;
   a first left NMOS and a first right NMOS, wherein the drain electrodes of said first left NMOS and said first right NMOS are respectively connected to the drain electrodes of said first left PMOS and said first right PMOS, and the gate electrodes of said first left NMOS and said first right NMOS are coupled together and expressed by said switching-control signal; and
   a second left NMOS and a second right NMOS, wherein the drain electrodes of said second left NMOS and said second right NMOS are respectively connected to the source electrodes of first left NMOS and first right NMOS, and the source electrodes of said second left NMOS and said second right NMOS are connected said low-end voltage signal controller, and the gate electrode of said second left NMOS is connected to the drain electrode of said second right NMOS, and the gate electrode of said second right NMOS is connected to the drain electrode of said second left NMOS.

6. The super leakage current cut-off device according to claim 1, wherein said first high-end power gating transistor and said second first high-end power gating transistor are PMOSs.

7. The super leakage current cut-off device according to claim 1, wherein said first low-end power gating transistor and said second first low-end power gating transistor are NMOSs.

* * * * *